United States Patent [19]

Tanikoshi et al.

[11] Patent Number: 4,795,919
[45] Date of Patent: Jan. 3, 1989

[54] ZERO SIGNAL STATE DETECTING CIRCUIT

[75] Inventors: Sadao Tanikoshi, Tokyo; Hiroyuki Ibe, Yokohama; Taro Shibagaki, Tokyo, all of Japan

[73] Assignee: Kabushiki Kaisha Toshiba, Kanagawa, Japan

[21] Appl. No.: 55,798

[22] Filed: Jun. 1, 1987

[30] Foreign Application Priority Data

Jun. 2, 1986 [JP] Japan .................. 61-127612

[51] Int. Cl.$^4$ .......................... H03K 5/153
[52] U.S. Cl. .................... 307/354; 307/358; 307/494; 307/520; 328/164
[58] Field of Search ........... 307/354, 358, 311, 362, 307/520, 494; 328/164

[56] References Cited

U.S. PATENT DOCUMENTS

| | | | |
|---|---|---|---|
| 3,708,678 | 1/1973 | Kreda ............................ | 307/358 |
| 3,912,943 | 10/1975 | Wilson ........................... | 307/358 |
| 4,241,309 | 12/1980 | Elder ............................. | 307/358 |
| 4,363,977 | 12/1982 | Tsuda et al. .................... | 307/358 |

Primary Examiner—John Zazworsky
Attorney, Agent, or Firm—Finnegan, Henderson Farabow, Garrett and Dunner

[57] ABSTRACT

This invention provides a zero signal state detecting circuit for detecting zero signal state of the signal in an optical receiver or optical repeater. The zero signal state detecting circuit in accordance with the present invention comprises a level shifting circuit, a smoothing circuit, a first comparator, a peak detecting circuit and a second comparator. The output signal from the timing circuit to produce two output signals is shifted by the level shifting circuit. One of the two outputs of the level shifting circuit is smoothed by the smoothing circuit. The output of the smoothing circuit and the other one of the outputs of the level shifting circuit are compared by the first comparator and the output is detected by the peak detecting circuit. The output of the peak detecting circuit is compared by the second comparator against a reference voltage, and the zero signal state of the optical receiving signal is detected.

5 Claims, 4 Drawing Sheets

ZERO SIGNAL STATE DETECTING CIRCUIT

BACKGROUND OF THE INVENTION

1. Field of the Invention

The present invention relates to a zero signal state detecting circuit for an optical receiver used in an optical digital transmission system, and more particularly, to a detecting circuit for detecting a zero signal state and preventing an operation error caused by a noise component of the signal.

2. Description of the Prior Art

A photo detecting circuit having an avalanche photodiode has been utilized for an optical receiver or optical repeater in an optical digital transmission system. The multiplication factor of the photodetecting circuit is controlled by an automatic gain control circuit to detect a received optical signal level. When an optical signal is not detected, the multiplication factor of the photodetecting circuit becomes large and the amplitude of the noise component becomes large. As a result, an error signal is received or repeated as if an optical signal were detected. In order to resolve the above problem, it is necessary to detect a zero signal state and stop the operation of the repeater or receiver.

One method for detecting a zero signal state is at the stage where a timing signal is extracted from the received signal and a transmission signal is regenerated. Such a zero signal state detecting circuit is disclosed in Japanese Patent Publication (Kokai) No. 57-133734, and the circuit disclosed therein is attached as FIG. 1. The zero signal state detecting circuit is utilized in an optical repeater having a timing clock extracting circuit. The timing circuit has a band pass filter 11, a tuning amplifier 12 and a differential type limiting amplifier 14. In the zero signal state detecting circuit, a zero signal state is detected by taking two differential output signals from the differential type limiting amplifier 15 and applying them to a zero signal state detecting circuit 16. A first of the differential output signals is provided to the base of a first transistor $Q_{11}$. The emitter of the first transistor is connected through first resistor $R_{11}$ for shifting the voltage level to a first constant-current generator comprised of second transistor $Q_{13}$ and second resistor $R_{13}$. The second of the differential output signals is provided to the base of third transistor $Q_{12}$. The emitter of the third transistor $Q_{12}$ is connected through third resistor $R_{12}$ to a second constant-current generator comprised of fourth transistor $Q_{14}$ and fourth resistor $R_{14}$.

The first of the differential output signals, voltage level-shifted by the first resistor, $R_{11}$ and the second of the differential output signals, taken at a point between the emitter and resistance $R_{12}$ so as not to be voltage level shifted, are applied to two input terminals of a first comparator 4. In the first comparator 4, an enlarged level difference is detected even if the difference of the amplitude between the received signal state and the zero signal state is small. The output of the first comparator 4 is provided to a peak detecting circuit 5, and the output of the peak detecting circuit is sent to a second comparator 6. The second comparator detects a zero signal state.

As mentioned above the first of the differential outputs from the limiting amplifier 14 is level-shifted by the first resistor. The level shifting voltage is controlled by varying the resistor value.

However, both collector currents of the first and third transistors $Q_{11}$ and $Q_{12}$ are unbalanced, so that the temperature characteristic of the level shifting voltage is not good. As a result, a zero signal state is not always correctly detected.

SUMMARY OF THE INVENTION

An object of the present invention is to provide a zero signal state detecting circuit which can detect a zero signal state correctly. Another object of the present invention is to provide a zero signal state detecting circuit which can detect a zero signal state correctly in an optical transmission system.

Briefly described, the objects of the present invention are accomplished by a zero signal state detecting circuit which includes a level shifting circuit for shifting the d.c. level of a signal, a smoothing circuit for smoothing the second of the two outputs of the level shifting circuit, a first comparator for comparing the output of the smoothing circuit and the other output of the level shifting circuit, a peak detecting circuit for detecting the peak level of the output of the first comparator, a second comparator for comparing the output of the peak detecting circuit with a predetermined threshold level. The output of the second comparator indicates the zero signal state.

BRIEF DESCRIPTION OF THE DRAWINGS

The features and advantages of the present invention will be more apparent from the following description of a preferred embodiment taken in conjunction with the accompanying drawings, in which.

DESCRIPTION OF THE PREFERRED EMBODIMENTS

Figure 2A:
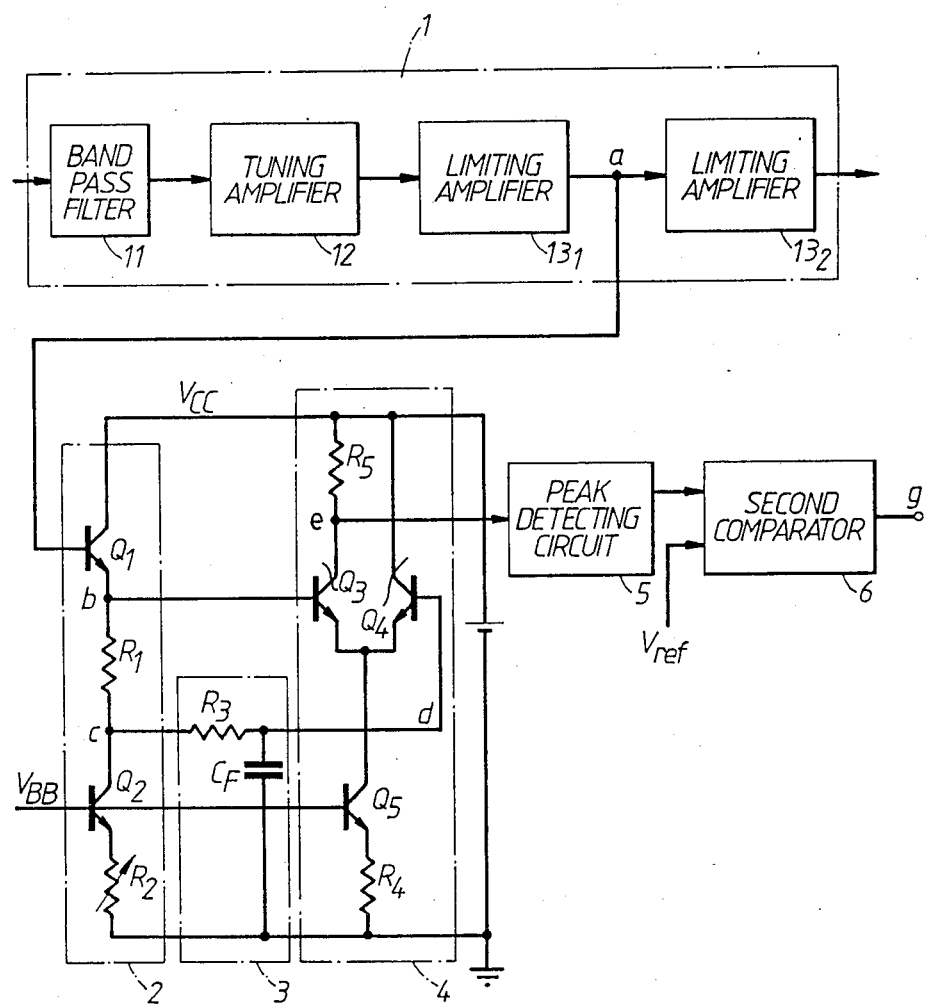
FIG. 2(a) discloses a zero signal state detecting circuit wherein the level shifting circuit comprises a bipolar transistor.

Referring to FIG. 2A a zero signal state detecting circuit according to a preferred embodiment of the invention is shown which can be used in an optical transmission system.

A timing clock extracting circuit 1 is a part of an optical receiver system and includes a band pass filter 11, tuning amplifier 12, first and second limiting amplifiers 16 and 17. The first limiting amplifier 16 is a single ended limiting amplifier with an output connected to a level shifting circuit 2. The level shifting circuit 2 has an npn type transistor $Q_1$ the base of which is connected to the output terminal of the first limiting amplifier 16. The collector of the transistor $Q_1$ is connected to a voltage source $V_{cc}$. The emitter of the transistor $Q_1$ is connected through a resistor $R_1$, which is used for shifting the voltage level, to a current source $I_{ee}$ which includes a transistor $Q_2$ and a variable resistor $R_2$. The output at terminal b between the emitter of the transistor $Q_1$ and the resistor $R_1$ is connected to a first input terminal e of a first comparator 4. The output at terminal c, between the resistor $R_1$ and the current source $I_{ee}$, is applied to a second input terminal of the first comparator 4 through a smoothing circuit 3. The smoothing circuit 3 is a low-pass filter having a resistor $R_3$ and a capacitor $C_F$. A direct current (d.c.) input signal is provided to the other input terminal d of the first comparator 4.

The first comparator 4 comprises a differential amplifier section $A_{dd}$ and a constant-current source section $I_{ff}$ having a transistor $Q_5$ and a resistor $R_4$. The differential amplifier section $A_{dd}$ comprises a pair of transistors $Q_3$ and $Q_4$ which have their emitters connected in common. The output of the first comparator 4, taken at the collector of transistor $Q_3$, is applied to a peak detecting circuit 5, and the peak level of the output of the first comparator 4 is detected. The output of the peak detecting circuit 5 is compared with a reference voltage in a second comparator 6 and a zero detect signal is outputted.

Figure 1:
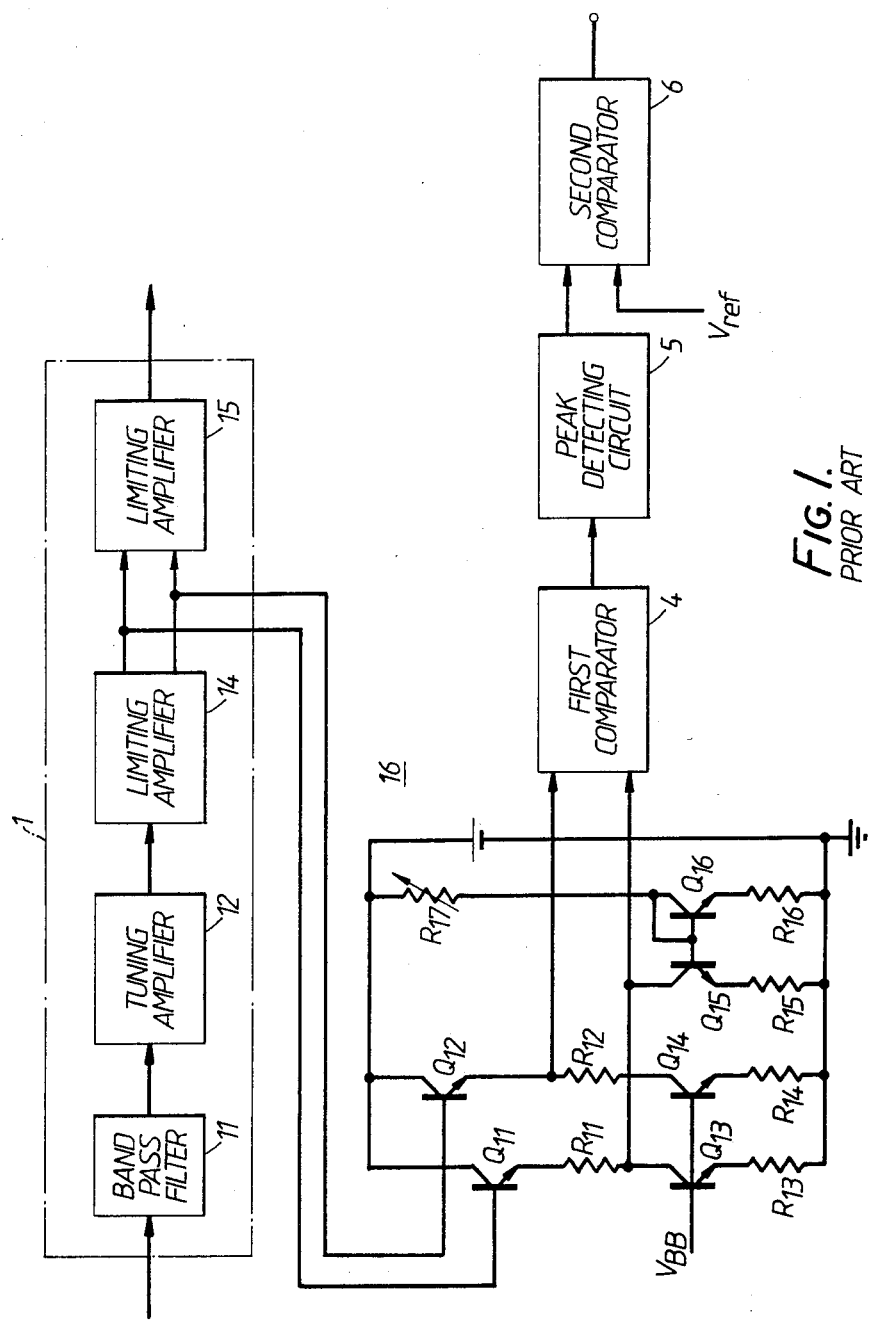
FIG. 1 shows a block diagram of a prior art zero signal state detecting circuit.
Figure 3:
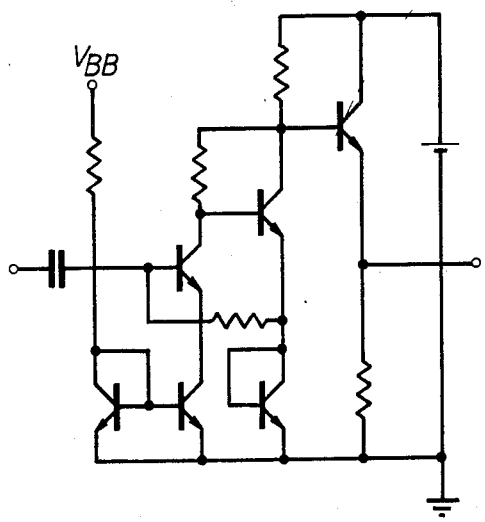
FIG. 3 illustrates a detailed circuit of a single ended limiting amplifier of the timing circuit shown in FIG. 2.

FIG. 3 illustrates a detailed circuit of the single ended limiting amplifier 16 used in the timing clock extracting circuit 1 shown in FIG. 1. The circuit shown in FIG. 3 is known, and need not be further described.

Figure 4A:
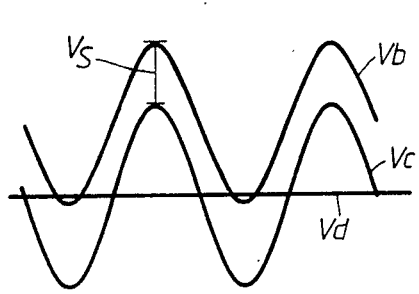
FIGS. 4(a) to 4(d) show waveform charts of the signals produced in the zero signal detecting circuit shown in FIG. 2.
Figure 4B:
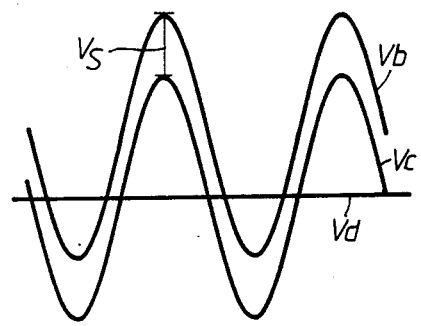
Figure 4C:
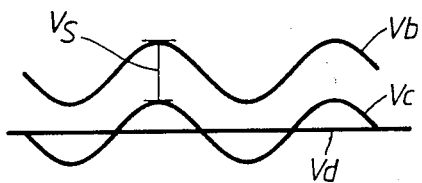
Figure 4D:
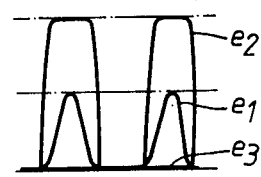

Referring to FIGS. 4(a) to 4(d), the operation of the aforementioned zero signal state detecting circuit will be explained. $V_b$, $V_c$ and $V_d$ are the electric potentials at points b, c and d respectively in the circuit of FIG. 2. $V_d$ is a d.c. voltage which is an output of the smoothing circuit 3. There is an electric potential difference $V_s$ between $V_b$ and $V_c$ which depends on the resistance of the resistor $R_1$. The first comparator 4 has an intermediate level output when the same electric potential is applied to the bases of the transistors $Q_3$ and $Q_4$. The first comparator 4 outputs a "High" level signal when the electric potential of the base of the transistor $Q_4$ is higher than that of the base of the transistor $Q_3$. The first comparator 4 outputs a "Low" level signal when the electric potential of the base of the transistor $Q_4$ is lower than that of the base of the transistor $Q_3$. FIG. 4(a) shows a waveform chart of the signal produced in the zero signal state detecting circuit, when the level shifting voltage is equal to the voltage which corresponds to the amplitude (zero-peak level) of the voltage $V_b$. In this case, the voltage at the output terminal f in the first comparator 4 will be at an intermediate voltage level $e_1$, as shown in FIG. 4(d). FIG. 4(b) shows a waveform chart of the signals produced in the zero signal state detecting circuit when a transmission signal exists. In this case, the amplitude of the output of the limiting amplifier 16 is large and the output of the first comparator 4 becomes a "High" level $e_2$ in a period as shown in FIG. 4(d). FIG. 4(c) shows a waveform chart of the signals produced in the zero signal state detecting circuit when a transmission signal does not exist. In this case, the amplitude of the output of the limiting amplifier 16 is small and the output of the first comparator 4 becomes a "Low" level signal $e_3$ as shown in FIG. 4(d). The peak level of the output signal from the first comparator 4 is detected and held in the peak detecting circuit 5. The peak level is compared with a reference voltage $V_{ref}$ in the second comparator 6. When the output of the peak detecting circuit 5 is lower than the reference voltage $V_{ref}$, a zero signal state is detected. The voltage $V_s$ depends on level shifting voltage which can be set up to control the variable resistor $R_2$ of the level shifting circuit 2. Therefore, the zero signal state detecting circuit can operate satisfactorily for every signal level, and a zero signal is outputted when the detected voltage is less than $2V_s$. The level shifting circuit according to the invention is not a differential type, and thus, the influence of temperature change and variations in voltage of the power source are small. As a result, the zero signal state can be satisfactorily and accurately detected.

Although the limiting amplifier 16 used in the present embodiment is constructed using the single ended limiting amplifier, it can be replaced with a known differential amplifier. But, the single ended limiting amplifier shows a smaller phase deviation, so that the performance of the receiver is superior.

Figure 2B:
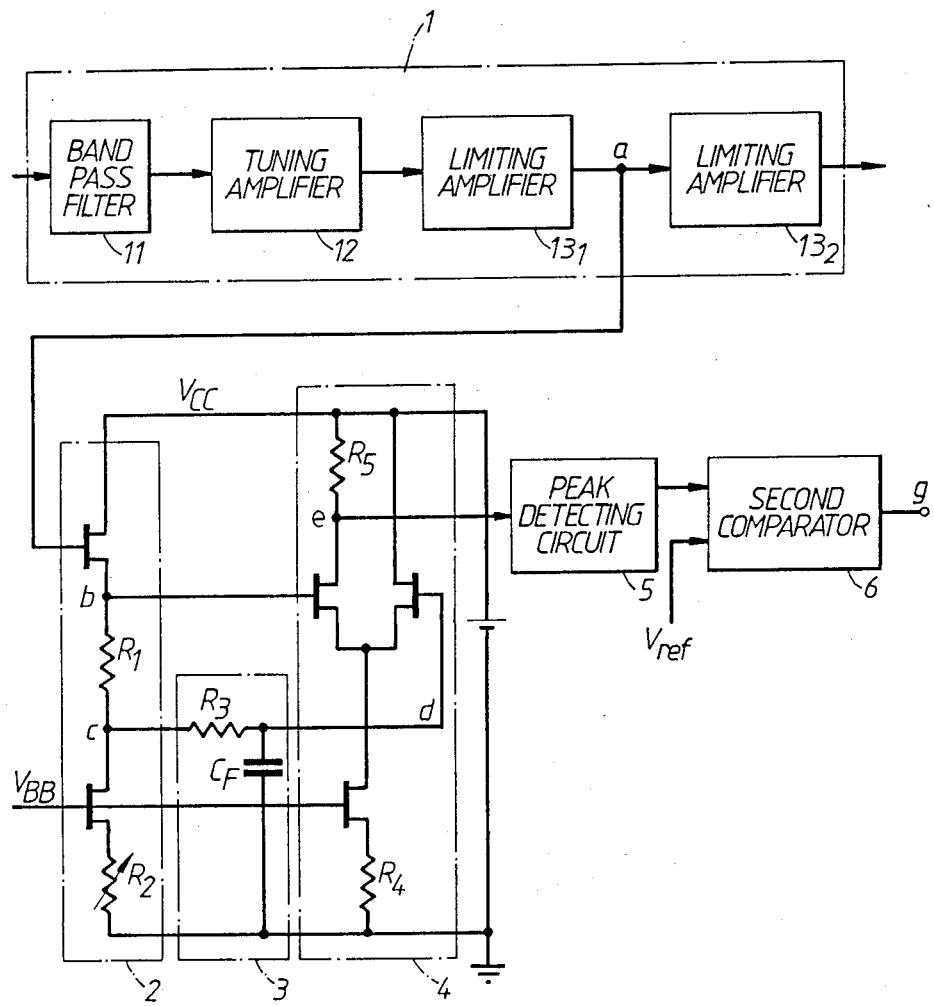
FIG. 2(b) discloses a zero signal state detecting circuit wherein the level shifting circuit comprises a field effect transistor.

In the above embodiment the level shifting circuit (2) is constructed by an emitter follower circuit having a bipolar transistor as shown in FIG. 2A, which may be replaced with a source follower circuit having a field-effect transistor as shown in FIG. 2B.

If control of the level shifting voltage is not required, the resistor $R_2$ may be replaced with one or more diodes.

Various modifications will become possible for those skilled in the art after receiving the teachings of the present disclosure without departing from the scope thereof.

What is claimed is:

1. A discriminator circuit for generating a zero signal level for a signal detected below a threshold level, comprising:
    level shifting means responsive to said detected signal for producing first and second output signals, the d.c. level of said second output signal being shifted respective to said first output signal by a shifting voltage $V_s$,
    wherein said level shifting circuit comprises a bipolar transistor with a base for receiving said signal, a resistor for level shifting connected to the emitter thereof and a constant current generator connected to the resistor;
    a smoothing circuit responsive to the second output signal of the level shifting means for generating a smoothed output signal;
    first comparator means for comparing the smoothed output signal of said smoothing circuit and the first output signal of the level shifting measns to produce an output signal;
    a peak detecting circuit responsive to said first comparator means for generating an output signal responsive to the peak level of the output signal of the first comparator means; and
    second comparator means for producing a zero level signal when the output signal of said peak detecting circuit is less than $2V_s$.

2. The discriminator circuit according to claim 1, further including a single ended limiting amplifier connected to the input of said level shifting means for providing the detected signal.

3. A discriminator circuit for gtenerating a zero signal level for a signal detected below a threshold level comprising:
    a timing circuit having a limiting amplifier for extracting a timing signal from a transmission signal;
    a level shifting means for shifting the d.c. level of the output signal of the limiting amplifier and providing a first and second output differing in voltage level by a voltage $V_s$,
    wherein said level shifting circuit comprises a bipolar transistor with a base for receiving said output signal of said limiting amplifier, a resistor for level shifting connected to the emitter thereof and a constant current generator connected to the resistor;

a smoothing circuit for smoothing one of said two outputs of the level shifting circuit;

a first comparator for comparing the output of the smoothing circuit with the other output of the level shifting circuit;

a peak detecting circuit for detecting the peak level of the output of the first comparator; and a second comparator for comparing the output of the peak detecting circuit with a threshold level, the output of the second comparator showing a zero signal state when the output signal of the limiting amplifier is below a threshold voltage.

4. A discriminator circuit for generating a zero signal level for a signal detected below a threshold level, comprising:

level shifting means responsive to said detected signal for producing first and second output signals, the d.c. level of said second output signal being shifted respective to said first output signal by a shifting voltage $V_s$, wherein said level shifting circuit comprises a field-effect transistor with a gate for receiving said signal, a resistor for level shifting connected to the source whereof and a constant current generator connected to the resistor;

a smoothing circuit responsive to the second output signal of the level shifting means for generating a smoothed output signal;

first comparator means for comparing the smoothed output signal of said smoothing circuit and the first output signal of the level shifting means to produce an output signal;

peak detecting circuit responsive to said first comparator means for generating an output signal responsive to the peak level of the output signal of the first comparator means; and second comparator means for producing a zero level signal when the output signal of said peak detecting circuit is less than $2V_s$.

5. A discriminator cirucit for generating a zero signal level for a signal detected below a threshold level comprising:

a timing circuit having a limiting amplifier for extracting a timing signal from a transmission signal;

a level shifting means for shifting the d.c. level of the output signal of the limiting amplifier and providing a first and second output differing in voltage level by a voltage $V_s$, wherein said level shifting circuit comprises a field-effect transistor with a gate for receiving said output signal of said limiting amplifier, a resistor for level shifting connected to the source thereof and a constant current generator connected to the resistor;

a smoothing circuit for smoothing one of said two outputs of the level shifting circuit;

a first comparator for comparing the output of the smoothing circuit with the other output of the level shifting circuit;

a peak detecting circuit for detecting the peak level of the output of the first comparator; and a second comparator for comparing the output of the peak detecting circuit with a threshold level, the output of the second comparator showing a zero signal state when the output signal of the limiting amplifier is below a threshold voltage.

* * * * *